United States Patent
Amako et al.

(10) Patent No.: US 12,060,472 B2
(45) Date of Patent: Aug. 13, 2024

(54) OPTICAL MEMBER RESIN SHEET, OPTICAL MEMBER, LAYERED BODY, OR LIGHT-EMITTING DEVICE COMPRISING OPTICAL MEMBER RESIN SHEET, AND METHOD FOR MANUFACTURING OPTICAL MEMBER RESIN SHEET

(71) Applicant: Dow Corning Toray Co., Ltd., Tokyo (JP)

(72) Inventors: Masaaki Amako, Chiba (JP); Takeaki Tsuda, Chiba (JP)

(73) Assignee: DuPont Toray Specialty Materials Kabushiki Kaisha, Tokyo (JP)

( * ) Notice: Subject to any disclaimer, the term of this patent is extended or adjusted under 35 U.S.C. 154(b) by 253 days.

(21) Appl. No.: 16/620,676

(22) PCT Filed: Jul. 19, 2018

(86) PCT No.: PCT/JP2018/027042
§ 371 (c)(1),
(2) Date: Dec. 9, 2019

(87) PCT Pub. No.: WO2019/021926
PCT Pub. Date: Jan. 31, 2019

(65) Prior Publication Data
US 2021/0139669 A1    May 13, 2021

(30) Foreign Application Priority Data
Jul. 28, 2017  (JP) .................................. 2017-146350

(51) Int. Cl.
*C08K 3/105*  (2018.01)
*B29C 65/00*  (2006.01)
(Continued)

(52) U.S. Cl.
CPC .............. *C08K 3/105* (2018.01); *B29C 65/00* (2013.01); *B32B 27/06* (2013.01); *C08J 5/18* (2013.01);
(Continued)

(58) Field of Classification Search
CPC .. B29C 65/00; B32B 27/06; C08J 5/18; C08J 2383/04; C08K 3/36; C08K 3/105;
(Continued)

(56) References Cited

U.S. PATENT DOCUMENTS 3,294,737 A   12/1966   Krantz
4,938,994 A    7/1990   Choinski
(Continued)

FOREIGN PATENT DOCUMENTS

CN        1503606 A    6/2004
CN      101116017 A    1/2008
(Continued)

OTHER PUBLICATIONS

WO2013089075A1—English Translation, Google, Jun. 20, 2013, pp. 1-13 (Year: 2013).*
(Continued)

*Primary Examiner* — Maria V Ewald
*Assistant Examiner* — Ethan Weydemeyer
(74) *Attorney, Agent, or Firm* — Howard & Howard Attorneys PLLC

(57) ABSTRACT

An optical member resin sheet has excellent characteristics as an optical member and exhibits excellent performance even if used for a light-emitting device or the like. The optical member resin sheet is characterized in that the difference between the thickness of an end of the sheet and the thickness of the center of the sheet in the width direction of the sheet is within 5.0% of the total film thickness of the sheet; in that the thickness of the center of the sheet is in the
(Continued)

range of 10-1000 μm; in that the sheet area is 225 mm² or more; and by containing at least one fluorescent substance or reflective material.

19 Claims, 2 Drawing Sheets

(51) Int. Cl.
*B32B 27/06* (2006.01)
*C08J 5/18* (2006.01)
*C08K 3/36* (2006.01)
*H01L 33/50* (2010.01)
*H01L 33/60* (2010.01)
*H01L 51/50* (2006.01)
*H01L 51/52* (2006.01)
*H10K 50/125* (2023.01)
*H10K 50/854* (2023.01)
*H10K 50/856* (2023.01)

(52) U.S. Cl.
CPC .............. *C08K 3/36* (2013.01); *H01L 33/502* (2013.01); *H01L 33/60* (2013.01); *H10K 50/125* (2023.02); *H10K 50/854* (2023.02); *H10K 50/856* (2023.02); *C08J 2383/04* (2013.01); *H01L 2933/0091* (2013.01)

(58) Field of Classification Search
CPC ... H01L 33/502; H01L 33/60; H01L 51/5036; H01L 51/5268; H01L 51/5271; H01L 2933/0091
See application file for complete search history.

(56) References Cited

U.S. PATENT DOCUMENTS

| | | | |
|---|---|---|---|
| 5,853,812 A | 12/1998 | Kawasaki et al. | |
| 6,309,692 B1 | 10/2001 | Nakamura et al. | |
| 7,109,651 B2 | 9/2006 | Nakamura et al. | |
| 8,040,041 B2 | 10/2011 | Hosokawa et al. | |
| 8,946,983 B2 | 2/2015 | Matsumura et al. | |
| 9,000,472 B2 | 4/2015 | Amako et al. | |
| 9,927,703 B2 | 3/2018 | Swier et al. | |
| 9,950,453 B2 | 4/2018 | Koellnberger et al. | |
| 10,357,947 B2 | 7/2019 | Fukui et al. | |
| 2010/0189880 A1 | 7/2010 | Gibson et al. | |
| 2014/0210338 A1* | 7/2014 | Matsumura | H01L 24/83 252/301.36 |
| 2016/0032148 A1* | 2/2016 | Amako | H01L 31/0547 156/60 |

FOREIGN PATENT DOCUMENTS

| | | |
|---|---|---|
| JP | H1076205 A | 3/1998 |
| JP | 2015510257 A | 4/2015 |
| JP | 2016500382 A | 1/2016 |
| JP | 2016508290 A | 3/2016 |
| JP | 2016119454 A | 6/2016 |
| JP | 2016522978 A | 8/2016 |
| TW | 201301582 A | 1/2013 |
| WO | 9726999 A1 | 7/1997 |
| WO | 2006075793 A1 | 7/2006 |
| WO | 2009093427 A1 | 7/2009 |
| WO | 2013089075 A1 | 6/2013 |
| WO | 2016163069 A1 | 10/2016 |
| WO | 2016194948 A1 | 12/2016 |
| WO | 2017057074 A1 | 4/2017 |
| WO | 2017094618 A1 | 6/2017 |
| WO | 2017094832 A1 | 6/2017 |

OTHER PUBLICATIONS

English language abstract for JP 2015-510257 A extracted from espacenet.com database on Mar. 3, 2021, 2 pages.
English language abstract for JP 2016-522978 A extracted from espacenet.com database on Mar. 3, 2021, 2 pages.
English language abstract for JP 2016-508290 A extracted from espacenet.com database on May 27, 2021, 2 pages.
English language abstract and machine-assisted English language translation for JP 2016-119454 A extracted from espacenet.com database on May 27, 2021, 66 pages.
English language abstract and machine-assisted English language translation for WO 2016/194948 A1 extracted from espacenet.com database on May 27, 2021, 17 pages.
English language abstract and machine-assisted English language translation for WO 2017/094832 A1 extracted from espacenet.com database on May 27, 2021, 28 pages.
International Search Report for Application No. PCT/JP2018/027042 dated Oct. 23, 2018, 2 pages.
English language abstract for JPH 10-76205 extracted from espacenet.com database on Dec. 18, 2019, 1 page.
English language abstract for JP 2016-500382 extracted from espacenet.com database on Dec. 18, 2019, 2 pages.
English language abstract for WO 97/26999 extracted from espacenet.com database on Dec. 18, 2019, 2 pages.
English language abstract for WO 2009/093427 extracted from espacenet.com database on Dec. 18, 2019, 2 pages.
English language abstract and machine-assisted English language translation for WO 2013/089075 extracted from espacenet.com database on Dec. 18, 2019, 21 pages.
English language abstract and machine-assisted English language translation for WO 2017/057074 extracted from espacenet.com database on Dec. 18, 2019, 41 pages.
English language abstract and machine-assisted English language translation for WO 2017/094618 extracted from espacenet.com database on Dec. 18, 2019, 18 pages.
English language abstract for CN 1503606 A extracted from espacenet.com database on Jun. 1, 2022, 2 pages.
English language abstract for CN 101116017 A extracted from espacenet.com database on Jun. 1, 2022, 1 page.
English language abstract for WO 2016/163069 A1 extracted from espacenet.com database on Jun. 1, 2022, 2 pages.
English language abstract for TW 201301582 A extracted from espacenet.com database on Feb. 2, 2022, 2 pages.

* cited by examiner

[Figure 1]
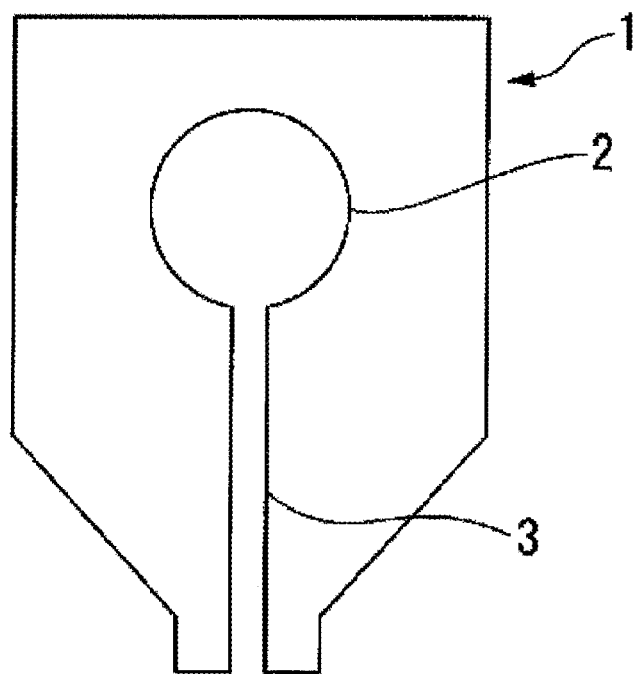

[Figure 2]
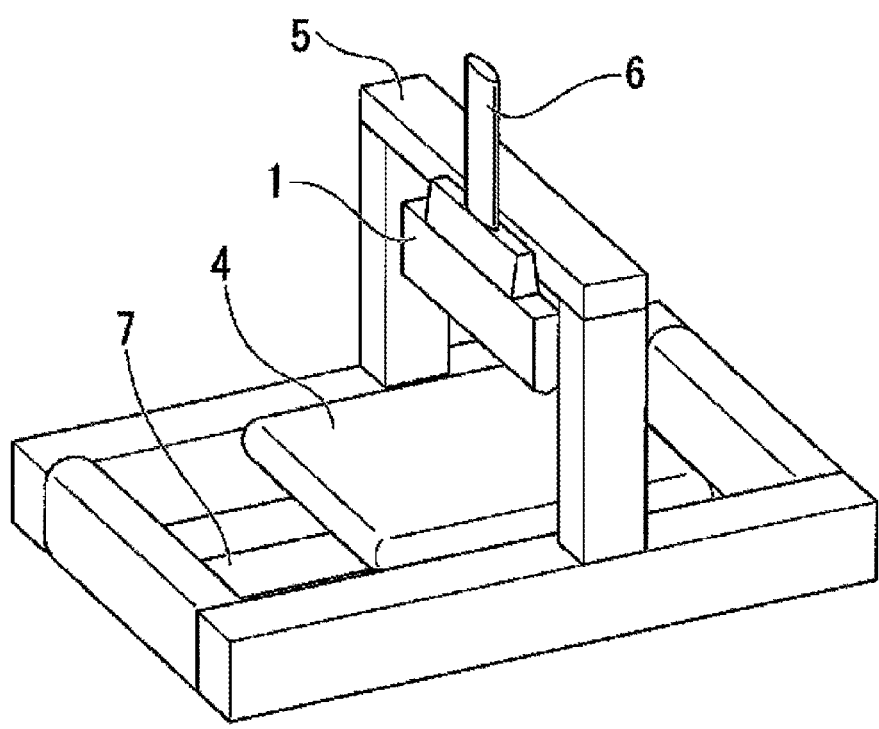

OPTICAL MEMBER RESIN SHEET, OPTICAL MEMBER, LAYERED BODY, OR LIGHT-EMITTING DEVICE COMPRISING OPTICAL MEMBER RESIN SHEET, AND METHOD FOR MANUFACTURING OPTICAL MEMBER RESIN SHEET

CROSS-REFERENCE TO RELATED APPLICATIONS

The present application is the National Stage of International Patent Application No. PCT/JP2018/027042, filed on Jul. 19, 2018, which claims priority to and all the benefits of Japanese Patent Application No. 2017-146350, filed on Jul. 28, 2017, which are both hereby expressly incorporated herein by reference in their entirety.

TECHNICAL FIELD

The present invention relates to an optical member resin sheet, an optical member, layered body or light-emitting device equipped with the same and a method for the production of an optical member resin sheet. In particular, the present invention relates to an optical member resin sheet exhibiting superior flatness which can be used in lighting, display devices, etc., an optical member, layered body or light-emitting device equipped with the same and a method for the production of an optical member resin sheet.

BACKGROUND ART

Optical member resin sheets exhibiting superior efficiency, physical properties, and durability are used in light-emitting devices, including LEDs. Since such resin sheets are used after being laminated onto, for example, an LED chip, they are required to exhibit superior flatness. Conventionally, continuous processes, such as a roll-to-roll process, have been used to manufacture such resin sheets, but while continuous processes are suitable for the large-volume production of sheets with large surface areas, they are not suitable for manufacturing a variety of different products in small lots such as LEDs etc.

Patent Document 1 discloses a sheet coating machine used in an inspection system. However, the substrate used in the sheet coating machine described in Patent Document 1 is made from glass and the document does not provide any disclosure regarding the coating of a flexible substrate such as a polymer film. Furthermore, Patent Document 2 discloses a method in which when producing a processing liquid film a film is formed after adjusting the conditions of a processing liquid. However, Patent Document 2 also does not provide any disclosure that the substrate corresponds to a flexible substrate such as a polymer film.

While Patent Document 3 discloses a basic sheet coating machine it does not provide any disclosure regarding how to control the quality of the product and whether sheets exhibiting superior flatness can be obtained. While Patent Documents 4 and 5 also disclose sheet coating machines, in both cases they are used for continuous processes and said documents do not disclose their use in the production of an optical member resin sheet.

PRIOR ART LITERATURE

Patent Literature

[Patent Document 1] US Patent No. 2010/0189880—Specifications
[Patent Document 2] Japanese Unexamined Patent Publication No. 10-76205
[Patent Document 3] U.S. Pat. No. 4,938,994
[Patent Document 4] International Patent Publication No. 97/26999
[Patent Document 5] Japanese Translation of PCT International Application Publication No. 2016-500382

SUMMARY OF THE INVENTION

Problems which the Invention Seeks to Solve

Therefore, there exists demand for a resin sheet which exhibits superior flatness as an optical member resin sheet used in optical devices, such as LEDs, etc., as well as a method for the production thereof. In particular, an optical member resin sheet which exhibits a level of flatness appropriate for products produced via a batch process suitable for small-lot production as well as a method for the production thereof, are not conventionally known.

Furthermore, there is a demand for a resin sheet which affords good efficiency in a light-emitting device such as an LED when used in an optical member comprising an optical member resin sheet, and also has superior durability, and a light-emitting device comprising same.

The present invention has been developed to solve the aforementioned problems identified in the prior art, and seeks to provide a resin sheet which exhibits superior properties as an optical member and which shows superior performance even when used in light-emitting devices, etc., as well as a method for the production thereof.

Means of Solving the Problems

After conducting an intensive study of the aforementioned problems, the inventors of the present invention arrived at the present invention. That is, the object of the present invention is achieved via an optical member resin sheet wherein the difference between the sheet edge thickness and sheet centre thickness relative to total sheet thickness, in relation to the sheet width direction, is no greater than 5.0%, the thickness of the sheet centre ranges from 10 to 1,000 μm and the sheet area is at least 225 mm², and which is characterized in that it contains at least one type of fluorescent substance or reflective material.

The width and length of the sheet are each preferably 15 mm or greater, and the sheet area is preferably 400 mm² or greater.

The thickness of the centre of the aforementioned sheet preferably ranges from 30 to 900 μm, and the difference between the sheet edge thickness and sheet centre thickness relative to total sheet thickness, in relation to the sheet width direction, is preferably no greater than 2.5%.

The fluorescent substance or reflective material is preferably included in an amount ranging from 10 to 90% by mass, relative to the total weight of the sheet.

The fluorescent substance or reflective material preferably has a structure wherein it is dispersed in a binder resin containing at least a silicone resin.

The optical member resin sheet constituted by the present invention is preferably heat-meltable.

The optical member resin sheet constituted by the present invention preferably includes:
(A) one or more fluorescent substances selected from oxide phosphors, oxynitride phosphors, nitride phosphors, sulphide phosphors, fluoride phosphors, and oxysulphide phosphors, and
(B) an organopolysiloxane having within its molecular structure arylsiloxane units represented by the formula $R^4SiO_{3/2}$ (wherein $R^4$ is an aryl group having 6 to 14 carbon atoms) and a polydiorganosiloxane structure represented by the formula $(R_2SiO_{2/2})_n$ (wherein R is an aryl group having 6 to 14 carbon atoms or an alkyl group having 1 to 20 carbon atoms, which may be halogen-substituted, and n is a number ranging from 3 to 1,000).

Component (A) is preferably included in an amount ranging from 10 to 90% by mass, relative to the total weight of the sheet.

Component (B) is preferably a binder resin of a solid particle component which includes at least Component (A), and is furthermore an organopolysiloxane represented by the formula $\{(R_2SiO_{2/2})\}_a\{R^4SiO_{3/2}\}_{1-a}$ (wherein R and $R^4$ are the same groups as described above and a is a number ranging from 0.8 to 0.2).

At least part of the aforementioned fluorescent substance or reflective material is preferably surface-treated with an organosilicon compound.

The reflective material is preferably one or more selected from titanium oxide, barium oxide, chromium oxide, iron oxide, boron nitride and titanium nitride.

The optical member resin sheet constituted by the present invention may further include (C) silica particles.

The present invention also relates to an optical member equipped with an optical member resin sheet constituted by the present invention.

Additionally, the present invention also relates to a layered body equipped with an optical member resin sheet constituted by the present invention.

A layered body constituted by the present invention may also be further equipped with a release layer.

Furthermore, the present invention also relates to a light-emitting device having a structure which is sealed with an optical member resin sheet constituted by the present invention.

Additionally, the present invention relates to a method for the production of an optical member resin sheet constituted by the present invention, which is characterized in that an optical member resin sheet starting material is applied to a substrate using a sheet coating machine at a viscosity at 25° C. of 10 to 10,000 mPa·s and a wet film thickness of 10 to 1,000 μm.

In the production method constituted by the present invention, production is preferably carried out with the hydraulic pressure build up time set to 1.0/w sec or less, with a coating speed of w (cm/sec), using a slit coater as the sheet coating machine.

Effects of the Invention

The present invention produces superior resin sheet flatness, which is advantageous when it is used as an optical member. In particular, when used as a member of a light emitting device such as an LED, it provides a member exhibiting superior wavelength conversion characteristics, light extraction efficiency and sealing performance.

Additionally, the method for the production of an optical member resin sheet constituted by the present invention can be performed using a batch process and is suitable for the production of a variety of different products in smaller lots. Moreover, since it is possible to produce an optical member resin sheet exhibiting superior flatness, a resin sheet which is ideal for use as a light-emitting device member can be produced.

BRIEF DESCRIPTION OF THE DRAWINGS

FIG. 1 This figure shows a schematic view of a coating head of a sheet coating machine according to one embodiment of the present invention.

FIG. 2 This figure shows a schematic view of a sheet coating machine according to one embodiment of the present invention.

MODES FOR CARRYING OUT THE INVENTION

The optical member resin sheet constituted by the present invention is described in detail below.

The optical member resin sheet constituted by the present invention is characterized in that the difference between the sheet edge thickness and sheet centre thickness relative to total sheet thickness, in relation to the sheet width direction, is no greater than 5.0% and the thickness of the sheet centre ranges from 10 to 1,000 μm. The sheet width direction corresponds to the direction perpendicular to the length direction of the sheet, and in general refers to the direction which is perpendicular on the surface to the direction in which coating or simple film formation is performed using a starting material composition on a substrate. Note that when a sheet is wound, the winding direction corresponds to the length direction while the width direction of the sheet corresponds to the direction perpendicular to the length direction. For a quadrilateral or approximately quadrilateral film, the width direction of the film is perpendicular to the length direction and for a square or approximately square film, any direction parallel to or perpendicular to each of the edges of said square or approximately square film may be taken as the width direction.

The optical member resin sheet constituted by the present invention is characterized in that the difference (absolute value) between the sheet edge thickness (μm) and sheet centre thickness (μm) relative to total sheet thickness, in relation to the sheet width direction, is no greater than 5.0%, with a difference between the sheet edge thickness and sheet centre thickness relative to total sheet thickness no greater than 4.0% preferable and a thickness differential of no greater than 2.5% particularly preferable. Note that that said sheet preferably has a flat and uniform structure substantially free of irregularities on the surface, including the bulges at both ends, and the maximum displacement (difference) in the thickness of the sheet in the width direction preferably does not exceed 5.0%. Additionally, is particularly preferable that the sheet is a flat sheet having a maximum thickness displacement (difference) of 5.0% or less over the whole sheet with no substantial unevenness present.

The optical member resin sheet constituted by the present invention is characterized in that it is a sheet material having a certain thickness such that the thickness at the centre of the sheet exceeds 10 μm, and in that it has a substantially flat structure with almost no variation in thickness within the sheet. Specifically, it is characterized in that the thickness of the sheet centre in the width direction ranges from 10 to 1,000 μm, with a sheet centre thickness ranging from 20 to 950 μm preferable and a sheet centre thickness ranging from 30 to 900 μm particularly preferable. When the thickness at the centre of the sheet falls below the aforementioned lower limit, the film thickness is too thin so applications as an optical member resin sheet may be limited and if the aforementioned upper limit is exceeded, the film thickness is two high when treating it as a single layer so it may not be suitable for applications, such as light-emitting devices, which require a lower thickness.

Note that since the optical member resin sheet constituted by the present invention is a flat resin sheet showing no substantial unevenness, it offers the advantage of not as readily forming bubble involutions, deformations and defects caused by unevenness between resin sheets when forming a uniform thick resin sheet layer by overlapping multiple resin sheets, as well as when a single layer is used. That is, although the optical member resin sheet constituted by the present invention has a thickness of 10 to 1000 μm, it can also be used to form a resin sheet layer exceeding 1000 μm by overlapping multiple film layers, to form an optical member used in various optical devices.

The optical member resin sheet constituted by the present invention is characterized in that it has a certain size (area), with a sheet area of 225 mm$^2$ or greater. The optical member resin sheet constituted by the present invention preferably has a sheet width and length which are each at least 15 mm, with at least 30 mm particularly preferable. Additionally, the sheet area is preferably 400 mm$^2$ or greater, with 900 mm$^2$ or greater particularly preferable. The optical member resin sheet constituted by the present invention is a flat film exhibiting no substantial unevenness, and may have a structure in which a curable composition used as a starting material is uniformly applied and cured, potentially on top of a release layer, so any length which permits winding onto a roll in the length direction may be used, with no particular limit. Moreover, said optical member resin sheet can be cut to a desired size or shape prior to use.

The optical member resin sheet constituted by the present invention is characterized in that it contains at least one type of fluorescent substance or reflective material.

There are no particular limits imposed on a fluorescent substance included in the optical member resin sheet constituted by the present invention, provided that it can function as a wavelength-converting material, with examples including yellow, red, green, and blue fluorescent substances made from oxide phosphors, oxynitride phosphors, nitride phosphors, sulphide phosphors, fluoride phosphors, oxysulphide phosphors, etc. which are widely used in light-emitting diodes (LEDs) as well as organic light-emitting devices (OLEDs). Examples of oxide phosphors include yttrium, aluminium, and garnet-based YAG green to yellow light-emitting phosphors containing cerium ions; terbium, aluminium, and garnet-based TAG yellow light-emitting phosphors containing cerium ions; and silicate-based green to yellow light emitting phosphors containing cerium and europium ions. Additionally, examples of oxynitride phosphors include silicon, aluminium, oxygen, and nitrogen-based sialon red to green light emitting phosphors containing europium ions. Examples of nitride-based phosphors include calcium, strontium, aluminium, silicon, and nitrogen-based CASN red light-emitting phosphors containing europium ions. Examples of sulphide-based phosphors include ZnS-based green coloured phosphors containing copper ions and aluminium ions. Examples of fluoride-based phosphors include KSF phosphors ($K_2SiF_6:Mn^{4+}$). Examples of oxysulphide phosphors include $Y_2O_2S$-based red light-emitting phosphors containing europium ions. A single fluorescent substance may be used or two or more fluorescent substances may be used in combination.

Although there are no particular limits imposed on the reflective material included in the optical member resin sheet constituted by the present invention, it may correspond to one or more varieties selected from titanium oxide, barium oxide, chromium oxide, iron oxide, boron nitride and titanium nitride. In particular, titanium oxide is preferable.

The fluorescent substance or reflective material included in the optical member resin sheet constituted by the present invention preferably has a structure wherein it is dispersed in a binder resin containing at least a silicone resin. Furthermore, in order to improve dispersibility in the silicone resin, at least part of the fluorescent substance or the reflective material may be surface-treated with an organosilicon compound. Specifically, at least part of the fluorescent substance or the reflective material may be surface-treated with alkoxysilane, organohalosilane, organosilazane, siloxane oligomer, etc.

The fluorescent substance or reflective material included in the optical member resin sheet constituted by the present invention is preferably included in an amount ranging from 10 to 90% by mass relative to the total weight of the sheet, with inclusion in an amount ranging from 15 to 85% particularly preferable.

The optical member resin sheet constituted by the present invention preferably includes:
(A) One or more fluorescent substances selected from a group comprising oxide phosphors, oxynitride phosphors, nitride phosphors, sulphide phosphors, fluoride phosphors, and oxysulphide phosphors, as well as
(B) An organopolysiloxane having within its molecular structure arylsiloxane units represented by the formula $R^A SiO_{3/2}$ (wherein $R^A$ is an aryl group having 6 to 14 carbon atoms) as well as a polydiorganosiloxane structure represented by the formula $(R_2SiO_{2/2})_n$ (wherein R is an aryl group having 6 to 14 carbon atoms or an alkyl group having 1 to 20 carbon atoms, which may be halogen-substituted, and n is a number ranging from 3 to 1,000).

Component (A) is preferably included in an amount corresponding to 10 to 90% by mass, relative to the total weight of the sheet, with inclusion in an amount corresponding to 15 to 85% by mass particularly preferable.

Component (B) is a solid particle component binder resin containing at least Component (A), and corresponds to a resin-linear polymer type organopolysiloxane containing aryl-bearing T units. Because Component (B) exhibits a high refractive index and hot meltability, it can readily form a uniform thin film-like solid layer.

Said Component (B) corresponds to an organopolysiloxane having within its molecular structure arylsiloxane units represented by the formula $R^A SiO_{3/2}$ (wherein $R^A$ is an aryl group having 6 to 14 carbon atoms) as well as a polydiorganosiloxane structure represented by the formula $(R_2SiO_{2/2})_n$ (wherein R is an aryl group having 6 to 14 carbon atoms or an alkyl group having 1 to 20 carbon atoms, which may be halogen-substituted, and n is a number ranging from 3 to 1,000).

Here, an aryl group having 6 to 14 carbon atoms is a phenyl group, a tolyl group, a xylyl group, a naphthyl group, or an anthracenyl group, and phenyl groups are preferable from the standpoint of industrial production. Furthermore, R is an alkyl group such as a methyl group, ethyl group, propyl group, butyl group, pentyl group, hexyl group, heptyl group, octyl group, nonyl group, decyl group, undecyl group or dodecyl group; an aryl group such as a phenyl group, tolyl group, xylyl group, naphthyl group or anthracenyl group; or a group in which some or all of the hydrogen atoms bonded to the above groups are substituted with a halogen atom such as a fluorine atom, chlorine atom or bromine atom, and a methyl group or phenyl group is preferable from a production standpoint.

More specifically, Component (B) has a structure in which a resin structure block bearing a siloxane unit expressed as a T unit: $R^1SiO_{3/2}$ (where $R^1$ is a monovalent organic group, hydroxyl group or alkoxy group having 1 to 6 carbon atoms and at least one instance of $R^1$ in each molecule is an aryl group having 6 to 14 carbon atoms) or, optionally, a Q unit: $SiO_{4/2}$ and a linear structure block expressed as $(R_2SiO_{2/2})_n$ (where n is a number as defined above and R is a functional group as defined above) are linked via a silalkylene bond or Si—O—Si bond, and is furthermore a resin-linear organopolysiloxane block copolymer bearing $R^4SiO_{3/2}$ units; and in the silalkylene bond or Si—O—Si bond which links the resin structure blocks and linear structure blocks within the polymer, Si atoms bonded to the resin structure preferably constitute the $R^1SiO_{3/2}$ units.

The resin structure blocks in Component (B) are a partial structure imparting hot meltability onto Component (B) as a whole, and exhibit a resin-like organopolysiloxane structure. Said structure forms a partial structure composed of resinous organopolysiloxane in which a large number of T units or Q units are bonded, and an arylsiloxane unit represented by $R^4SiO_{3/2}$ is required. In particular, when a large number of aryl groups, such as phenyl groups, are included in the molecular structure, the refractive index of Component (B) can be increased. Preferably, Component (B) is an organopolysiloxane containing arylsiloxane units represented by $R^4SiO_{3/2}$ (where $R^4$ is a functional group as described above) in an amount equal to 20 to 80% by mass of the entire organopolysiloxane, and the resin structure is particularly preferably substantially entirely formed from arylsiloxane units represented by $R^4SiO_{3/2}$ from the standpoint of hot meltability as well as refractive index as mentioned above.

The linear structure is a non-reactive block represented by $(R_2SiO_{2/2})_n$ and the diorganosiloxy unit represented by $R_2SiO_{2/2}$ is a structure in which at least 3, but preferably at least 5, units are linked together in the form of a chain. Said linear structure block is a partial structure which confers a moderate level of flexibility onto the solid layer formed by the copolymer. In the above formula, n is the degree of polymerization of the diorganosiloxy units constituting said partial structure, and should preferably range from 3 to 250, with ranges of 5 to 250, 50 to 250 and 100 to 250 more preferable. When the n term of the partial structure exceeds the above upper limit, linear molecular properties derived from a linear structure are strongly expressed, and thin film formability may be inadequate. On the other hand, if n is less than the above lower limit, linear molecular properties may be inadequate, and the characteristic physical properties of Component (B) may not be realized, such that, particularly when the film is made thin, cissing etc. readily occurs it cannot be applied uniformly, etc.

The functional group R included in the diorganosiloxy unit constituting the linear structure is an alkyl group or an aryl group, which are non-reactive with respect to the resin structure within the same molecule as well as functional groups thereof, and it is necessary to maintain a linear structure without causing a polymerization reaction such as a condensation reaction, etc within the molecules. Said alkyl groups and aryl groups correspond to groups as described above, and are preferably a methyl group or a phenyl group from the standpoint of industrial production.

The resin structure and linear structure blocks included in Component (B) are preferably connected via a silalkylene bond derived from a hydrosilylation reaction between an alkenyl group and a silicon atom-bonded hydrogen atom, or an Si—O—Si bond derived from a condensable reactive group at the end of the resin structure or linear structure. In particular, in the context of the present invention, Si atoms bonded to a resin structure preferably constitute the $R^1SiO_{3/2}$ units, and it is particularly preferable that they have the following partial structure (T-Dn). From the standpoint of industrial production, $R^1$ is preferably a phenyl group, while R is preferably a methyl group or phenyl group.

[Chemical Formula 1]

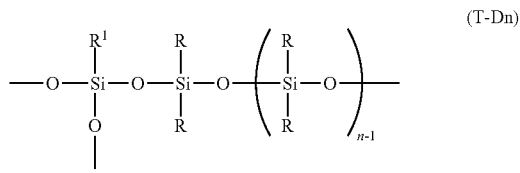

(T-Dn)

Preferably, in the aforementioned partial structure, the terminal of the Si—O— bond on the left side constituting each T unit is bonded to a hydrogen atom or another siloxane unit constituting the resin structure, preferably another T unit. On the other hand, the terminal of the Si—O— bond on the right side is bonded to another siloxane unit which forms the linear structure or resin structure, a triorganosiloxy unit (M unit) or a hydrogen atom. Note that when a hydrogen atom is bonded to the terminal of the Si—O— bond, a silanol group (Si—OH) is formed.

From the standpoint of the heat meltability of Component (B), refractive index required for improving light extraction efficiency, and uniform coatability particularly when the film is made thin, Component (B) is preferably a non-reactive organopolysiloxane comprising only arylsiloxane units expressed as $R^4SiO_{3/2}$ and diorganosiloxane units expressed as $R_2SiO_{2/2}$. More specifically, Component (B) is preferably an organopolysiloxane expressed via the following formula:

$$\{(R_2SiO_{2/2})\}_a\{R^4SiO_{3/2}\}_{1-a}$$

Wherein, R and $R^4$ correspond to the functional groups specified above and a preferably corresponds to a number ranging from 0.8 to 0.2, with a range of 0.8 to 0.4 more preferable.

Component (B) preferably exhibits heat meltability, specifically, it is preferably nonfluxional at 25° C. and shows a melt viscosity at 100° C. of 200,000 Pa·s or less. Here, nonfluxional means that the material does not flow while in an unloaded state, e.g., below the softening point of a hot melt adhesive as determined via the ring and ball method specified in JIS K 6863-1994 "Methodology for Testing the Softening Point of a Hot Melt Adhesive". That is, in order for the material to be nonfluxional at 25° C., the softening point must be higher than 25° C. Preferably, Component (B) exhibits a melt viscosity at 100° C. of 200,000 Pa·s or less, 100,000 Pa·s or less, 50,000 Pa·s or less, 20,000 Pa·s or less, or within a range of 10 to 20,000 Pa·s. When melt viscosity at 100° C. falls within the above range, the adhesiveness of the thin film, etc. formed after a hot melt procedure and after cooling to 25° C. is favourable. Additionally, the use of a Component (B) having a melt viscosity ranging from 100 to 15,000 Pa·s may in some cases effectively inhibit deformation or peeling of the thin film formed after moulding is performed.

Component (B) is preferably included in an amount corresponding to 10 to 90% by mass, relative to the total weight of the sheet, with inclusion in an amount corresponding to 15 to 85% by mass particularly preferable.

The optical member resin sheet constituted by the present invention may include (C) silica particles. Silica particles can act as reinforcing filler, and the shape of the particles is not restricted in any particular way. Both solid silica and hollow silica can be used, and in particular when hollow silica is used, high light diffusibility can be realized due to the difference in refractive index.

Component (C) is preferably included in an amount corresponding to 0 to 70% by mass, relative to the total weight of the sheet, with inclusion in an amount corresponding to 0 to 50% by mass particularly preferable.

For the optical member resin sheet constituted by the present invention, an organohydrogenpolysiloxane is preferably included as a crosslinking agent for Component (A) above, and furthermore the inclusion of a curing catalyst (hydrosilylation reaction catalyst, etc.) and a curing retarder (inhibitor) is preferable. Furthermore the inclusion of the aforementioned organohydrogenpolysiloxane or organopolysiloxane, preferably a polydiorganosiloxane having a degree of siloxane polymerization ranging from 2 to 150 as a plasticizer is preferable.

For the organohydrogenpolysiloxane, an organohydrogenpolysiloxane having two or more silicon-bonded hydrogen atoms within its molecular structure can be used without any particular restrictions, and when Component (A) includes an alkenyl group, the amount of silicon-bonded hydrogen atoms in the organohydrogenpolysiloxane should preferably range from 0.2 to 5 moles per 1 mole of alkenyl groups. Additionally, though the molecular structure of the organohydrogenpolysiloxane is not subject to any particular limitations, and one or more types of organohydrogenpolysiloxane selected from linear, branched, resinous or cyclic forms having a siloxane polymerization degree of 1000 or less can be used without any particular limitations.

For the curing catalyst, a hydrosilylation reaction catalyst, condensation catalyst, photoactive catalyst, peroxide catalyst, and other known curing agents can be used without any particular limitations and from the standpoint of reaction control, and the use of a hydrosilylation reaction catalyst is preferable. In addition, when using a hydrosilylation reaction catalyst, a well known curing retarder may be added from the standpoint of handling and workability as well as curability control.

For the optical member resin sheet constituted by the present invention, an optional additive, such as an adhesion improver, for example, an organofunctional alkoxysilane compound such as vinyltriethoxysilane, allyltrimethoxysilane, allyltriethoxysilane, 3-glycidoxypropyltrimethoxysilane, 3-glycidoxypropylmethyldiethoxysilane or 3-methacryloxypropyltrimethoxysilane, can be included, provided the object of the present invention is not hindered. Additionally, other optional components, including antioxidants such as those based on phenol, quinone, amine, phosphorus, phosphite, sulphur, thioether, etc.; light stabilizers such as those based on triazole, benzophenone, etc.; flame retardants such as those based on phosphate esters, halogens, phosphorus, antimony, etc.; one or more antistatic agents selected cationic surfactants, anionic surfactants and nonionic surfactants; as well as dyes, pigments, etc. may also be added provided they do not impair the technical effect provided by the present invention. Note that when making a thin film, any particle component having an average primary particle diameter exceeding 100 nm should preferably not be added.

The raw starting material used for the optical member resin sheet constituted by the present invention may be dispersed in an organic solvent prior to coating in order to form a film or thin coating as described below. The type of organic solvent used is not limited in any particular way provided that it is a compound capable of dissolving all or some of the constituent components of the composition, and the use of a solvent with a boiling point ranging from 80° C. to 200° C. is preferable. Examples include non-halogen solvents such as i-propyl alcohol, t-butyl alcohol, cyclohexanol, cyclohexanone, methyl ethyl ketone, methyl isobutyl ketone, toluene, xylene, mesitylene, 1,4-dioxane, dibutyl ether, anisole, 4-methylanisole, ethylbenzene, ethoxybenzene, ethylene glycol, ethylene glycol dimethyl ether, ethylene glycol diethyl ether, 2-methoxyethanol (ethylene glycol monomethyl ether), diethylene glycol dimethyl ether, diethylene glycol monomethyl ether, ethyl acetate, butyl acetate, propylpropionate, 1-methoxy-2-propyl acetate, 1-ethoxy-2-propyl acetate, octamethylcyclotetrasiloxane and hexamethyldisiloxane as well as halogen-based solvents such as trifluoromethylbenzene, 1,2-bis (trifluoromethyl) benzene, 1,3-bis (trifluoromethyl) benzene, 1,4-bis (trifluoromethyl) benzene, trifluoromethylchlorobenzene, trifluoromethylfluorobenzene and hydrofluoroether. The above organic solvents may be used either alone or in a combination of two or more. From the standpoint of handling and workability, solid layer uniformity and improved heat resistance, the use of i-propyl alcohol, methyl isobutyl, etc. is preferable.

The hardness of the optical member resin sheet constituted by the present invention will depend on the substrate and so is not limited in any particular way, but in practice it should preferably correspond to 2B or more in terms of pencil hardness.

The optical member resin sheet constituted by the present invention, can be particularly suitably used as a solid layer constituting a layered body structure and in particular it is preferably placed at the interface with the surrounding air as a solid layer that constitutes a light emitting device or a layered body used in a light emitting device.

In one embodiment, the optical member resin sheet constituted by the present invention can be used as a member of a layered body equipped with a release layer. When the optical member resin sheet constituted by the present invention is formed on top of a release layer, the optical member resin sheet of the present invention or layered member equipped with the same may be used after it is separated from the release layer. Examples of laminated bodies constituted by the present invention include laminated bodies having the following structures. Note that in the following examples, "/" indicates that the layers oppose each other in the layering direction of the layered body (generally the thickness direction perpendicular to the substrate). Additionally, the substrate and the release layer may be integrated or part of the same layer (a substrate made releasable by establishing material or physical unevenness) and each layer may be composed of multiple layers.

Example 1: Substrate/Release Layer/Optical Member Resin Sheet Constituted by the Present Invention/Other Optional Layers Example 2: Substrate/Release Layer/Optical Member Resin Sheet Constituted by the Present Invention/Other Optional Layers/Release Layer/Substrate In particular, when the structure is such that an optical member resin sheet constituted by the present invention or optical member equipped with the same is sandwiched between two release layers as in Example 2, it is possible to transport a member equipped with an optical member resin sheet constituted by the present invention while it is protected by the substrate and the substrate equipped with the release layers can be separated from both faces of the layered body at a desired time and place and the optical member resin sheet constituted by the present invention or the optical member only can be positioned on and laminated onto a target structure, such as the light source of a light-emitting device, etc. Therefore, it is useful in terms of being able to improve handling and workability.

The substrate used in the layered body is not particular limited in any way, with examples including paperboard, cardboard paper, clay coated paper, polyolefin laminated paper, particularly polyethylene laminated paper, synthetic resin film, natural fiber cloth, synthetic fiber cloth, artificial leather cloth and metal foil. In particular, a synthetic resin film is preferable, with examples of synthetic resin including polyimides, polyethylene, polypropylene, polystyrene, polyvinyl chloride, polyvinylidene chloride, polycarbonate, polyethylene terephthalate, cyclopolyolefin, nylon, etc. The substrate is preferably in the form of a film or sheet. The corresponding thickness is not limited in any particular way, and the substrate may be designed with a desired thickness based on the application. It should be noted that, as described below, the base material itself may be a material that functions as a release layer, and may have a structure which has been conferred a certain degree of releasability by physically forming fine irregularities on the surface of the substrate, etc.

A release layer is sometimes also referred to as a release liner, detachment layer or release coating layer, and may preferably be a release layer having release coating functionality, such as a silicone release agent, fluorine release agent, alkyd release agent or fluorosilicone release agent, or a substrate which does not readily adhere to the optical member resin sheet constituted by the present invention due to the physical formation of minute irregularities on the surface of the substrate.

Other layers included in the layered body may correspond to one or more layers or may correspond to two or more layers equipped with different functions. Furthermore, the total thickness of the layered members laminated onto the optical member resin sheet constituted by the present invention is not particularly limited in any way, but it is preferably 10 µm or greater with a range of 50 to 10,000 µm more preferable and a range of 100 to 5,000 µm particularly preferable from the standpoint of handling and workability.

The optical member resin sheet constituted by the present invention as well as layered bodies equipped with the same may be used as a sealing sheet, and may bear a structure whereby they are positioned on top of the light source of a light-emitting device such as an organic light emitting diode, sealing it. Here, light emitted from a light source is subject to wavelength conversion when the optical member resin sheet constituted by the present invention includes a fluorescent substance.

In one embodiment, the optical member resin sheet constituted by the present invention is produced by applying optical member resin sheet starting material to a substrate using a sheet coating machine at a viscosity at 25° C. of 10 to 10,000 mPa·s and a wet film thickness of 10 to 1,000 µm.

The substrate used in the method for the production of an optical member resin sheet constituted by the present invention is preferably a flexible substrate. Specifically, a substrate as listed among the substrates used in the aforementioned layered body may be used.

Examples of well known methods used to coat a flexible substrate with a coating solution include curtain coating, bar coating, etc., with curtain coating suitable for mass production but not suitable for batch processing in small lots. Additionally, when used to apply a particularly high-viscosity coating solution or particle-containing coating solution, bar coating suffers from the drawback that the sheet surface cannot be kept uniform.

In contrast, methods which employ an applicator or slit coater are suitable as methods for producing an optical member resin sheet constituted by the present invention due to the fact that they make it possible to relatively easily implement batch processes with small lots. In particular, the use of a slit coater is preferable.

A slit coater that can be used in the method for the production of an optical member resin sheet constituted by the present invention is described here with reference to the attached figure. FIG. 1 shows a schematic view of a coating head of a sheet coating machine according to one embodiment of the present invention.

As shown in FIG. 1, coating head 1 is equipped with a chamber 2 and a slot 3. A coating composition is supplied to chamber 2 using a pump, etc. The coating composition is supplied from the side of coating head 1 or the side opposite slot 3.

The provision of the coating composition to chamber 2 is preferably performed at a coating speed of w (cm/sec) with the hydraulic pressure build up time set to 1.0/w sec or less. During the start of coating, it is necessary to rapidly form a stable bead between the coating head and the substrate and if the hydraulic pressure build up time is less than that specified above, it is possible to reduce sheet loss caused by uneven film thickness at the start of the coating process.

The shape of chamber 2 is not particularly limited in any way, and the chamber may be circular or semicircular. Moreover, a plug may be provided on at least one of the side surfaces so that the composition does not leak during the coating process.

Slot 3 is a flow path used when the coating composition is discharged from chamber 2 to the substrate. As with chamber 2, a plug may be provided on at least one of the side surfaces so that the composition does not leak during the coating process. Moreover, an adjustment mechanism may be provided so that the width and length of slot 3 can be adjusted.

When coating the substrate with the coating composition, coating head 1 is positioned close to the substrate and the coating composition is supplied onto the substrate via chamber 2 and slot 3, after which coating head 1 or the substrate is moved in one direction. When this happens, the distance between the coating head and the substrate is preferably kept constant. Additionally, both may by moved simultaneously to apply a coating such that the relative speed of both is kept constant.

Furthermore, the tip of coating head 1 may or may not be parallel to the substrate. Additionally, the angle between the slot and the substrate is not limited in any particular way and may be, for example, perpendicular or not perpendicular to the substrate.

FIG. 2 shows a schematic view of a sheet coating machine according to one embodiment of the present invention, which in addition to a coating head 1, is also equipped with a stage 4, coating head mounting base 5, movable element to move the coating head up and down 6 and moveable element to move the stage sideways 7.

Stage 4 is a support base upon which the substrate is placed, and is preferably equipped with a fixing means for ensuring that the substrate does not move during the coating process. The fixing means may be suction from a suction port provided on the surface of the stage 4 or may be physical fixing employing a metal fitting, etc.

Coating Head 1 is positioned on top of stage 4 and coating head 1 is fixed in place by mounting base 5 as well as movable element 6. Mounting Base 5 is independent of stage 4 and during the coating process mounting base 5 or stage 4 move in the horizontal direction. When stage 4 moves, stage 4 moves in the horizontal direction via movable element 7. When mounting base 5 moves, mounting base 5 may be move via rails running along both sides of stage 4.

Coating Head 1 can be moved vertically with respect to stage 4 via movable element 6. Thus, the distance between coating head 1 and stage 4 can be altered depending on the physical properties of the coating composition to be used in coating, the target film thickness, the displacement speed of stage 4 or mounting base 5 during the coating process, etc.

The optical member resin sheet constituted by the present invention can be handled in the form of a layered body and a resin sheet placed on top of a release layer can be used once peeled. The peeled resin sheet can be used to seal a light emitting device when used as an optical member.

A resin sheet formed on a substrate or release layer can be appropriately cut before use as necessary. In particular, end portions of the film where film thickness tends to be uneven can be cut off to further improve the flatness of the film.

EXAMPLES

The present invention is illustrated in detail by, but is not limited to, the following examples. Note that in all the Examples below, parts are given in terms of parts per mass.

Synthesis of Organopolysiloxane

Synthesis Example 1

Phenylsilsesquioxane hydrolyzate (324 g, 2.37 mol Si) and propyl propionate (275 g) were added to a 2 L four-necked round bottom flask and mixed together. Under a nitrogen atmosphere, the mixture was heated and reacted for 30 minutes under reflux. The reaction mixture was cooled to 100° C., after which a propylpropionate solution (66%, 610.8 g) of diacetoxy-terminated polyphenylmethylsiloxane (degree of siloxane polymerization: 170) was added. The mixture was heated and refluxed for two hours and then left to stand overnight. Vinylmethyldiacetoxysilane (21 g, 0.11 mol Si) was then added and the mixture was refluxed for one hour, after which water (57 mL) was added and azeotropic dehydration was performed to reduce the concentration of acetic acid. The resulting reaction mixture was cooled to 100° C., after which a 1:1 mixture of methyltriacetoxysilane and ethyltriacetoxysilane (38.7 g, 0.17 mol Si) was added and the mixture was refluxed for one hour. Water (57 mL) was then added, and the acetic acid concentration was reduced via azeotropic dehydration. The above procedure was repeated an additional two times, after which propyl propionate was partially distilled off, transparent propyl propionate solution of organopolysiloxane having a resin-linear polymer structure (weight average molecular weight: 83,000, solids concentration: 74.2%) was obtained.

A platinum divinyldisiloxane complex with a platinum content of 1 ppm and mean unit formula of $(HMe_2SiO_{1/2})_{0.60}(PhSiO_{3/2})_{0.4}$ was added such that the SiH/Vi ratio was 1, after which propyl propionate was further added to prepare a propyl propionate solution containing a total of 75.5% siloxane.

Synthesis Example 2

Phenylsilsesquioxane hydrolyzate (324 g, 2.37 mol Si) and toluene (268 g) were added to a 2 L four-necked round bottom flask and mixed together. Under a nitrogen atmosphere, the mixture was heated and reacted for 30 minutes under reflux. The reaction mixture was cooled to 100° C., after which a toluene solution (65%, 608 g) of diacetoxy-terminated polyphenylmethylsiloxane (degree of siloxane polymerization: 100) was added. After the reaction mixture was heated under reflux for 2 hours, methyltriacetoxysilane (38 g, 0.17 mol Si) was added and the mixture was refluxed for 2.5 hours. Vinylmethyldiacetoxysilane (21 g, 0.11 mol Si) was then added and the mixture was refluxed for two hours, after which water (76 mL) was added and azeotropic dehydration was performed for 30 minutes until the organic layer had separated and the aqueous layer was removed from below. Next, water was replaced with saturated saline, and the same procedure was repeated twice to lower the acetic acid concentration, after which the same procedure was repeated an additional two times with water. The toluene was partially distilled off, to obtain a toluene solution of organopolysiloxane having a transparent resin-linear polymer structure (weight average molecular weight: 60,000, solids concentration: 75.8%). Using a rotary evaporator, propyl propionate was added to the toluene solution and toluene was removed three times to obtain a transparent propylpropionate solution of organopolysiloxane having a resin-linear polymer structure (solids concentration: 78%).

A platinum divinyldisiloxane complex with a platinum content of 1 ppm and mean unit formula of $(HMe_2SiO_{1/2})_{0.60}(PhSiO_{3/2})_{0.4}$ was added such that the SiH/Vi ratio was 1, after which propyl propionate was further added to prepare a propyl propionate solution containing a total of 75.5% siloxane.

(Preparation of Resin Sheet Composition)

Example 1

8.0 g of the solution obtained in Synthesis Example 1 above, 5.93 g of fluorescent substance (manufactured by Intematix, NYAG 4454-L), 9.59 g of silica particles (manufactured by Denka, FB-SSDC, mean particle size: 5 μm) and 3.25 g of propyl propionate were mixed together and stirred until uniform using an automatic stirrer (Thinky Co., ARV-310LED) equipped with a vacuum degassing mechanism to obtain Resin Sheet Composition 1. The viscosities of the thixotropic solution were 2,173 mPa·s (10 1/s) and 5,105 mPa·s (1 1/s). T788 PET film manufactured by Daicel Value Coating Co., Ltd. was coated with a frame applicator (IMC-3501 type) manufactured by Imoto Seisakusho using a coating machine (PI-1210 FILM COATER), with a gap of 260 μm. Thereafter, the coated sheet was dried in an oven at 70° C. for 30 minutes. The sheet thus obtained was a rectangular sheet having a width of 150 mm and a length of 310 mm.

The film thickness of the sheet thus obtained in the width direction was measured using a film thickness meter (DIGI-MICRO MFC-101A, manufactured by Nikon), and the film had a uniform thickness of 103±1 μm.

Example 2

8.0 g of the solution obtained in Synthesis Example 1 above, 15.53 g of fluorescent substance (manufactured by Intematix, NYAG 4454-L) and 1.75 g of propyl propionate were mixed together and stirred until uniform using an automatic stirrer (Thinky Co., ARV-310LED) equipped with a vacuum degassing mechanism to obtain Resin Sheet Composition 2. The viscosity was 3,269 mPa·s (10 1/s). T788 PET film manufactured by Daicel Value Coating Co., Ltd. was coated with a frame applicator (IMC-3501 type) manufactured by Imoto Seisakusho using a coating machine (PI-1210 FILM COATER), with a gap of 253 μm. Thereafter, the coated sheet was dried in an oven at 70° C. for 30 minutes. The sheet thus obtained was a rectangular sheet having a width of 150 mm and a length of 310 mm.

The film thickness of the sheet thus obtained in the width direction was measured using a film thickness meter (DIGI-MICRO MFC-101A, manufactured by Nikon), and the film had a uniform thickness of 103±1 μm.

Example 3

40.0 g of the solution obtained in Synthesis Example 1 above and 7.56 g of fluorescent substance (manufactured by Intematix, NYAG 4454-S) were mixed together and stirred until uniform using an automatic stirrer (Thinky Co., ARV-310LED) equipped with a vacuum degassing mechanism to obtain Resin Sheet Composition 3. The viscosity was 10,573 mPa·s (10 1/s). T788 PET film manufactured by Daicel Value Coating Co., Ltd. was coated with a frame applicator (IMC-3501 type) manufactured by Imoto Seisakusho using a coating machine (PI-1210 FILM COATER), with a gap of 236 μm. Thereafter, the coated sheet was dried in an oven at 70° C. for 30 minutes. The sheet thus obtained was a rectangular sheet having a width of 150 mm and a length of 310 mm.

The film thickness of the sheet thus obtained in the width direction was measured using a film thickness meter (DIGI-MICRO MFC-101A, manufactured by Nikon), and the film had a uniform thickness of 93±1 μm.

Example 4

40.0 g of the solution obtained in Synthesis Example 1 above, 7.33 g of fluorescent substance (manufactured by Intematix, NYAG 4454-S) and 0.25 g of REOROSEAL (DM-30) were mixed together and stirred until uniform using an automatic stirrer (Thinky Co., ARV-310LED) equipped with a vacuum degassing mechanism to obtain Resin Sheet Composition 4. The viscosity was 11,988 mPa·s (10 1/s). T788 PET film manufactured by Daicel Value Coating Co., Ltd. was coated with a frame applicator (IMC-3501 type) manufactured by Imoto Seisakusho using a coating machine (PI-1210 FILM COATER), with a gap of 236 μm. Thereafter, the coated sheet was dried in an oven at 70° C. for 30 minutes. The sheet thus obtained was a rectangular sheet having a width of 160 mm and a length of 310 mm.

The film thickness of the sheet thus obtained in the width direction was measured using a film thickness meter (DIGI-MICRO MFC-101A, manufactured by Nikon), and the film had a uniform thickness of 93±1 μm.

Example 5

40.0 g of the solution obtained in Synthesis Example 2 above and 20.12 g of titanium oxide (SX-3103, mean 0.2 μm D) were mixed together and stirred until uniform using an automatic stirrer (Thinky Co., ARV-310LED) equipped with a vacuum degassing mechanism to obtain Resin Sheet Composition 5. The viscosity was 9,554 mPa·s (10 1/s). T788 PET film manufactured by Daicel Value Coating Co., Ltd. was coated with Resin Sheet Composition 5 with a frame applicator (IMC-3501 type) manufactured by Imoto Seisakusho using a coating machine (PI-1210 FILM COATER), with a gap of 254 μm. Thereafter, the coated sheet was dried in an oven at 70° C. for 30 minutes. The sheet thus obtained was a rectangular sheet having a width of 160 mm and a length of 310 mm.

The film thickness of the sheet thus obtained in the width direction was measured using a film thickness meter (DIGI-MICRO MFC-101A, manufactured by Nikon), and the film had a uniform thickness of 106±2 μm.

Comparative Example 1

Resin Sheet Composition 3 prepared in Example 3 was used to coat a release sheet (Daicel Corporation, T788) using a bar (manufactured by R.D. Specialties Co., No. 10). Thereafter, the coated sheet was dried in an oven at 70° C. for 30 minutes. The sheet thus obtained was a rectangular sheet having a width of 150 mm and a length of 300 mm.

The film thickness of the sheet thus obtained in the width direction was measured using a film thickness meter (DIGI-MICRO MFC-101A, manufactured by Nikon), and the film had a non-uniform thickness ranging from 42 to 54 μm (the difference in the thickness at the sheet edge and the thickness at the sheet centre was 12 μm).

As shown above, while substantially flat optical member resin sheets were obtained in Examples 1 through 5, it was not possible to obtain a flat optical member resin sheet in Comparative Example 1, which used a different production process.

INDUSTRIAL APPLICABILITY

The optical member resin sheet constituted by the present invention as well as layered bodies equipped with the same can be suitably employed as optical members used in optical devices such as LEDs, etc. Moreover, the method for the production of an optical member resin sheet constituted by the present invention can be suitably used for the purposes of producing a variety of different optical member resin sheets in small lots.

DESCRIPTION OF THE REFERENCE NUMERALS

1 Coating head
2 Chamber
3 Slot
4 Stage
5 Mounting base
6 Movable element
7 Movable element

The invention claimed is:

1. An optical member resin sheet wherein the difference between the sheet edge thickness and sheet center thickness relative to total sheet thickness, in relation to the sheet width direction, is no greater than 5.0%, the thickness of the sheet center ranges from 10 to 1,000 μm and the sheet area is at least 225 mm$^2$, and which is characterized in that the sheet contains at least one fluorescent substance or reflective material, wherein the optical member resin sheet comprises:

(A) one or more fluorescent substances selected from oxide phosphors, oxynitride phosphors, nitride phosphors, sulphide phosphors, fluoride phosphors, and oxysulphide phosphors;

(B) a resin-linear organopolysiloxane block copolymer having within its molecular structure an alkenyl group, siloxane units represented by the formula $R^A SiO_{3/2}$, whereas $R^A$ is an aryl group having 6 to 14 carbon atoms and a polydiorganosiloxane structure represented by the formula $(R_2SiO_{2/2})_n$, whereas R is an aryl group having 6 to 14 carbon atoms or an alkyl group having 1 to 20 carbon atoms, which may be halogen-substituted, and n is a number ranging from 3 to 1,000; an organohydrogenpolysiloxane having the formula $(HR^B{}_2SiO_{1/2})_{0.60}(PhSiO_{3/2})_{0.4}$, where each $R^B$ is methyl, and at least two silicon-bonded hydrogen atoms, wherein the resin-linear organopolysiloxane block copolymer is non-flowable at 25° C.; and a hydrosilyilation reaction catalyst.

2. An optical member resin sheet as claimed in claim 1, wherein the width and length of the are each 15 mm or greater and the sheet area is 400 mm² or greater.

3. An optical member resin sheet as claimed in claim 1, wherein the thickness of the center of the sheet ranges from 30 to 900 µm, and the difference between the sheet edge thickness and sheet center thickness relative to total sheet thickness, in relation to the sheet width direction, is no greater than 2.5%.

4. An optical member resin sheet as claimed in claim 1, wherein the fluorescent substance or reflective material is included in an amount ranging from 10 to 90% by mass, relative to the total weight of the sheet.

5. An optical member resin sheet as claimed in claim 1, wherein the fluorescent substance or reflective material is dispersed in a binder resin containing at least a silicone resin.

6. An optical member resin sheet as claimed in claim 1, which is characterized in that the sheet is heat-meltable.

7. An optical member resin sheet as claimed in claim 1, wherein Component (A) is included in an amount ranging from 10 to 90% by mass, relative to the total weight of the sheet.

8. An optical member resin sheet as claimed in claim 1, wherein Component (B) is a binder resin of a solid particle component which includes at least Component (A), and is furthermore an organopolysiloxane represented by the formula $\{(R_2SiO_{2/2})\}_a\{R^A SiO_{3/2}\}_{1-a}$ (wherein R and $R^A$ are the same groups as described above and a is a number ranging from 0.8 to 0.2).

9. An optical member resin sheet as claimed in claim 1, wherein at least part of the fluorescent substance or reflective material is surface-treated with an organosilicon compound.

10. An optical member resin sheet as claimed in claim 1, wherein the sheet contains the reflective material and wherein the reflective material is one or more selected from titanium oxide, barium oxide, chromium oxide, iron oxide, boron nitride and titanium nitride.

11. An optical member resin sheet as claimed in claim 1, which further contains (C) silica particles.

12. An optical member equipped with the optical member resin sheet as claimed in claim 1.

13. A layered body equipped with the optical member resin sheet as claimed in claim 1.

14. A layered body as claimed in claim 13, further comprising a release layer.

15. A light-emitting device having a structure sealed with the optical member resin sheet as claimed in claim 1.

16. A method for the production of an optical member resin sheet having the difference between the sheet edge thickness and sheet centre thickness relative to total sheet thickness, in relation to the sheet width direction, of no greater than 5.0% and having the thickness of the sheet centre in the range of from 10 to 1,000 µm and the sheet area of at least 225 mm² which is characterized in that an optical member resin sheet starting material is applied to a substrate using an applicator or slit coater as a sheet coating machine at a viscosity at 25° ° C. of 10 to 10,000 mPa·s and a wet film thickness of 10 to 1,000 µm, wherein the optical member resin sheet starting material includes a resin-linear organopolysiloxane block copolymer having within its molecular structure an alkenyl group, siloxane units represented by the formula $R^A SiO_{3/2}$, whereas $R^A$ is an aryl group having 6 to 14 carbon atoms and a polydiorganosiloxane structure represented by the formula $(R_2SiO_{2/2})_n$, whereas R is an aryl group having 6 to 14 carbon atoms or an alkyl group having 1 to 20 carbon atoms, which may be halogen-substituted, and n is a number ranging from 3 to 1,000; an organohydrogenpolysiloxane having the formula $(HR^B{}_2SiO_{1/2})_{0.60}(PhSiO_{3/2})_{0.4}$, where each $R^B$ is methyl, and at least two silicon-bonded hydrogen atoms, wherein the resin-linear organopolysiloxane block copolymer is non-flowable at 25° C.

17. A method for the production of an optical member resin sheet claimed in claim 16, which is characterized in that production is carried out with the hydraulic pressure build up time set to 1.0/w sec or less, with a coating speed of w (cm/sec), using a slit coater as the sheet coating machine.

18. An optical member resin sheet as claimed in claim 2, wherein the thickness of the center of the sheet ranges from 30 to 900 µm, and the difference between the sheet edge thickness and sheet center thickness relative to total sheet thickness, in relation to the sheet width direction, is no greater than 2.5%.

19. An optical member resin sheet wherein the difference between the sheet edge thickness and sheet center thickness relative to total sheet thickness, in relation to the sheet width direction, is no greater than 5.0%, the thickness of the sheet center ranges from 10 to 1,000 µm and the sheet area is at least 225 mm², and which is characterized in that it contains at least one type of fluorescent substance or reflective material, wherein the optical member resin sheet comprises:

(A) one or more fluorescent substances selected from oxide phosphors, oxynitride phosphors, nitride phosphors, sulphide phosphors, fluoride phosphors, and oxysulphide phosphors;

(B) a resin-linear organopolysiloxane block copolymer having within its molecular structure an alkenyl group, siloxane units represented by the formula $R^A SiO_{3/2}$, whereas $R^A$ is an aryl group having 6 to 14 carbon atoms and a polydiorganosiloxane structure represented by the formula $(R_2SiO_{2/2})_n$, whereas R is an aryl group having 6 to 14 carbon atoms or an alkyl group having 1 to 20 carbon atoms, which may be halogen-substituted, and n is a number ranging from 3 to 1,000;

an organohydrogenpolysiloxane having the formula $(HR^B{}_2SiO_{1/2})_x(R^A SiO_{3/2})_y$, where each $R^B$ is methyl and $R^A$ is an aryl group having 6 to 14 carbon atoms, x=0.6, y=0.4, and at least two silicone-bonded hydrogen atoms, wherein the resin-linear organopolysiloxane block copolymer is non-flowable at 25° C.; and a hydrosilylation reaction catalyst.

* * * * *